United States Patent [19]

Stryker

[11] 3,839,660

[45] Oct. 1, 1974

[54] POWER SEMICONDUCTOR DEVICE PACKAGE

[75] Inventor: Harry L. Stryker, Kokomo, Ind.

[73] Assignee: General Motors Corporation, Detroit, Mich.

[22] Filed: Sept. 24, 1973

[21] Appl. No.: 399,840

Related U.S. Application Data

[63] Continuation-in-part of Ser. No. 329,655, Feb. 5, 1973, abandoned.

[52] U.S. Cl. ......... 357/67, 174/52 PE, 357/81, 357/72, 357/74, 357/71

[51] Int. Cl. ......... H01l 3/00

[58] Field of Search ......... 317/234, 1, 3, 3.1, 4, 317/4.1, 5.3, 5.2; 174/52 S, 52 PE

[56] References Cited

UNITED STATES PATENTS

| | | | |
|---|---|---|---|
| 3,283,224 | 11/1966 | Erkan | 317/234 |
| 3,365,628 | 1/1968 | Luxem et al. | 317/234 M |
| 3,451,030 | 6/1969 | Garfinkel | 317/234 M |
| 3,708,720 | 1/1973 | Whitney et al. | 317/234 A |
| 3,763,403 | 10/1973 | Lootens | 317/234 E |

*Primary Examiner*—Andrew J. James
*Attorney, Agent, or Firm*—Robert J. Wallace

[57] ABSTRACT

A power semiconductor device package that includes a ceramic substrate having a plurality of discrete solderable contact pads. A semiconductor die is soldered to one of the contact pads. The substrate in turn is mounted on a metallic package base member. A tri-layered terminal lead is provided for soldering to the contact pads. Each terminal lead has an outer layer of solder on one surface, a middle layer of stainless steel, and a layer of aluminum on an opposite surface. Aluminum filamentary wires extend from the die to the aluminum layer of the terminal leads. A non-rigid material on the die and over the filamentary wires protects the same from contaminants and possible damage during production. A plastic encapsulation covers the substrate except for a portion of the metallic package base member and outer ends of the terminal leads.

3 Claims, 5 Drawing Figures

POWER SEMICONDUCTOR DEVICE PACKAGE

CROSS-REFERENCE TO RELATED APPLICATION

This application is a continuation-in-part of co-pending United States application, Ser. No. 329,655, entitled "Plastic Encapsulated Power Semiconductor," filed Feb. 5, 1973 and now abandoned.

BACKGROUND OF THE INVENTION

This invention involves a power semiconductor device package having a semiconductor die which is electrically isolated from a supporting metallic package base member. More particularly, it involves a distinctive semiconductor device package with unique terminal leads which facilitate internal and external package interconnections.

OBJECTS AND SUMMARY OF THE INVENTION

It is the object of this invention to provide a distinctive power semiconductor device package having the die electrically isolated from the base member of the package and having unique terminal leads that facilitate internal and external package interconnections.

The semiconductor device package includes a ceramic substrate having discrete solderable contact pads thereon with a semiconductor die soldered to one of the contact pads. The substrate is supported by a metallic member that forms a heat conductive base portion of the package. A tri-layered terminal lead is provided for soldering to the contact pads. Each terminal lead has an outer layer of solder on one surface, a middle layer of stainless steel, and a layer of aluminum on an opposite surface. Aluminum filamentary wires extend from the die to the aluminum layer of the terminal leads. A plastic encapsulation covers the substrate and a protective non-rigid material over the die and filamentary wires, leaving the bottom surface of the metallic package base member and outer ends of the terminal leads exposed.

DESCRIPTION OF THE PREFERRED EMBODIMENT

Figure 1:
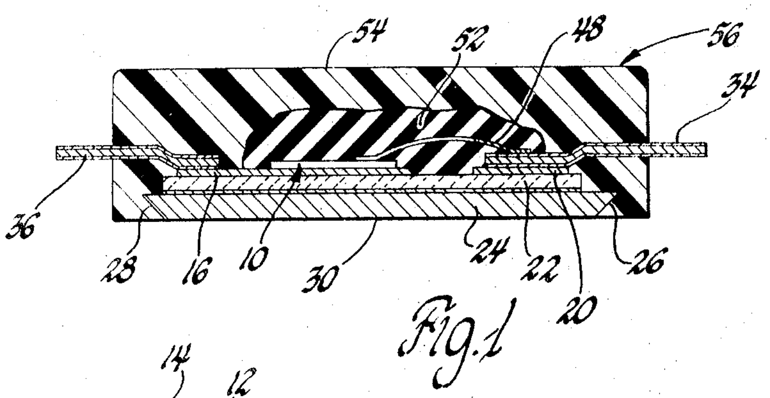
FIG. 1 is a cross-sectional view of one embodiment of the semiconductor device package of this invention which includes a transistor die.
Figure 2:
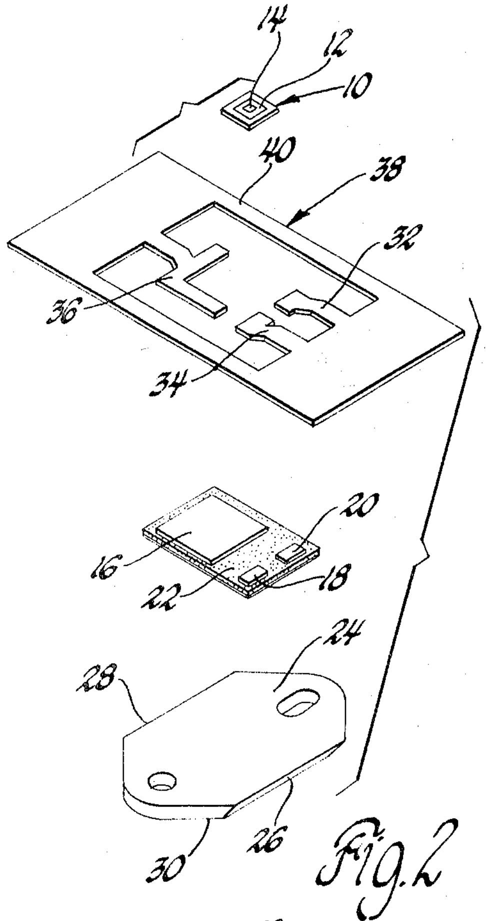
FIG. 2 is an exploded isometric view of the basic elements of the package shown in FIG. 1 before encapsulation in plastic.
Figure 3:
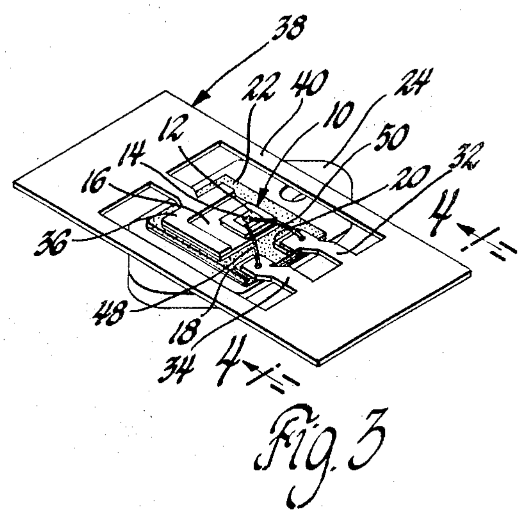
FIG. 3 is an isometric view of the package of FIG. 1 before encapsulation.
Figure 4:
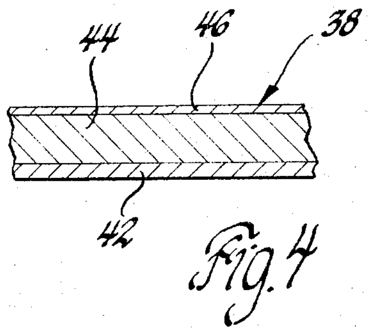
FIG. 4 is an enlarged fragmentary cross-sectional view along the line 4—4 of FIG. 3.

Referring now to FIGS. 1 – 6 of the drawings, transistor die 10 is a silicon power transistor of the mesa type made by diffusion technology. However, transistor die 10 can be of any type, such as a planar transistor die. The transistor die 10 is primarily of N-type conductivity silicon which serves as a collector region. A layer of P-type impurities diffused into the upper surface of the die serves as a base region of the transistor die. An island of N-type conductivity in the base layer serves as an emitter region for the transistor die. The base and the emitter regions have aluminum electrodes 12 and 14, respectively, on one face of the die. The collector region has a solderable nickel coating (not shown) serving as an electrode on the opposite face of the die. Although the transistor die 10 is described as an NPN device, transistor die 10 could also be a PNP device.

The transistor die 10 is soldered to a corner portion of solderable area, or contact pad 16. Contact pad 16 is the larger of three contact pads located on one face of substrate 22. Contact pad 16 is located towards one end of the substrate, while contact pads 18 and 20 are disposed at an opposite end. The contact pads 16, 18 and 20 can be provided, for example, by the known process of metallizing with moly-manganese or with a palladium silver cermet to provide solderable areas. Contact pad 16 is approximately 0.425 inch square, while contact pads 18 and 20 are rectangular areas approximately 0.100 inch by 0.172 inch in dimension.

A thin rectangular sheet of electrically insulating ceramic serves as substrate 22. Different types of ceramic substrates may be used, however, beryllia or alumina substrates are often chosen since their thermal expansion characteristics are similar to that of silicon. In this example, beryllia (BeO) is chosen because its thermal conductivity is approximately seven times greater than that of alumina ($Al_2O_3$). It should be noted that the transistor die 10 is in intimate thermal association with the substrate 22 so that heat generated therein is readily transferred to the substrate to remove the heat from the die. The dimensions of the substrate 22 are approximately 0.665 inch by 0.485 inch by 0.020 inch. A face opposite the face containing contact pads 16, 18 and 20 is entirely covered with the same metallization as the contact pads. This face of the substrate 22 is soldered to package base member 24.

Package base member 24 is an elongated diamond shape having flat sides and rounded ends. Each end has a hole for mounting the finished package on a support. Package member 24 is made of copper and is approximately 0.062 inch thick. As can be seen, edges 26 and 28 of the flat sides of package base member 24 slope inward toward outer surface 30 of the member. This is to insure good mechanical adhesion of the plastic encapsulation, hereinafter described, to the package base member 24. Small protrusions on the edges of the package base member 24 can also perform this function.

Terminal leads 32, 34 and 36 are initially a part of lead frame 38. Lead frame 38 is a rectangular unitary body having the terminal leads 32, 34, 36 extending inwardly as fingers from a peripheral rim portion 40. The lead frame 38 facilitates handling and orientation of the terminal leads during assembly of the transistor package. The terminal leads 32, 34 and 36 are bent near their ends to facilitate easy interconnection with contact pads 20, 18 and 16, respectively. Terminal lead 36 extends from an opposite side of rim 40 from terminal leads 32 and 34. The end of terminal leads 32, 34 and 36 are in a plane parallel to and spaced from the plane of the peripheral rim 40 of lead frame 38. Terminal leads 32 and 34 have enlarged rectangular end portions. Terminal lead 36, however, has an L-shaped end portion. The L-shape of the end portion of terminal lead 36 gives a good mechanical connection to the contact pad 16. Furthermore, it adds support to the lead frame 38 before the peripheral rim 40 is severed from the terminal leads. The end portion of terminal lead 36 has a somewhat larger area than the end portion of terminal leads 32 and 34, however, their thicknesses are the same.

The lead frame 38 is in entirety a tri-layered laminate comprising a first outer layer 42 of solder on one surface, a middle layer 44 of stainless steel, and a second outer layer 46 of aluminum on an opposite surface. The first outer layer 42 is approximately 0.002 inch thick and the solder composition may be any of those known in the art. A 90 percent lead and 10 percent tin mixture is sufficient and used in this example. The middle layer 44 of stainless steel is approximately 0.015 inch thick. The second outer layer 46 of aluminum is approximately 0.001 inch thick. The terminal leads 32, 34 and 36 are soldered to contact pads 20, 18 and 16, respectively, with the first outer layer 42 of solder directly contacting the contact pads. The soldered connections between the contact pads and terminal leads may be made simply by bringing the two surfaces together and heating them to reflow the solder of the terminal leads. It should be noted that the terminal lead 36 is soldered directly to contact pad 16 and partially surrounds the transistor die 10. This allows terminal lead 36 to make the electrical connection to the collector region of the transistor die 10 without further interconnection such as filamentary wires. The middle layer 44 of stainless steel provides a corrosion resistant core which gives the terminal leads strength and rigidity. It also provides an electrically resistant weldable material to which external circuitry may be welded.

A thin aluminum filamentary wire 48 extends from the base region electrode 12 of transistor die 10 to the aluminum second outer layer 46 of terminal lead 34. Similarly, aluminum filamentary wire 50 extends from the emitter region electrode 14 of transistor die 10 to the aluminum second outer layer 46 of terminal lead 32. The second outer layer 46 of aluminum of the terminal leads provides a wire bondable surface for the aluminum filamentary wires 48 and 50. The filamentary wire connection may be made by known ultrasonic or thermocompression bonding. Since the contact pads, filamentary wires, and second outer layer 46 of the terminal leads are all made of aluminum, this insures good reliability and bond strength.

A rubbery silicone gel 52 such as Room Temperature Vulcanizeable rubber covers the transistor die 10, the filamentary wires 48 and 50, and its area of interconnection to terminal leads 32 and 34. The gel protects the filamentary wires. It also protects the die by providing a cover to prevent contaminants from depositing on portions of the transistor die 10.

Figure 5:
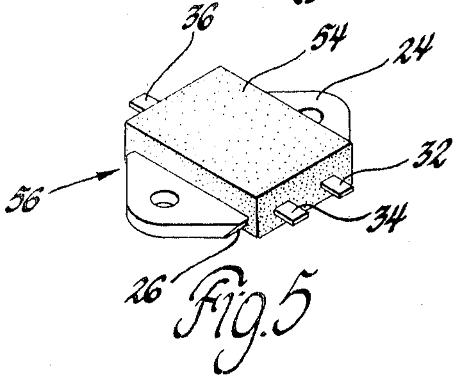
FIG. 5 is an isometric view of the encapsulated package of FIG. 1.

Referring now especially to FIGS. 1 and 5, an encapsulation 54 of plastic, preferably an epoxy plastic, surrounds a major portion of the assembly exposing only the bottom surface 30 of package base member 24, peripheral rim 40, and outer portions of the terminal leads. The peripheral rim 40 of the lead frame 38 is sheared from terminal leads 32, 34 and 36, as by stamping, leaving the completed transistor package 56.

Figures 6, 7:
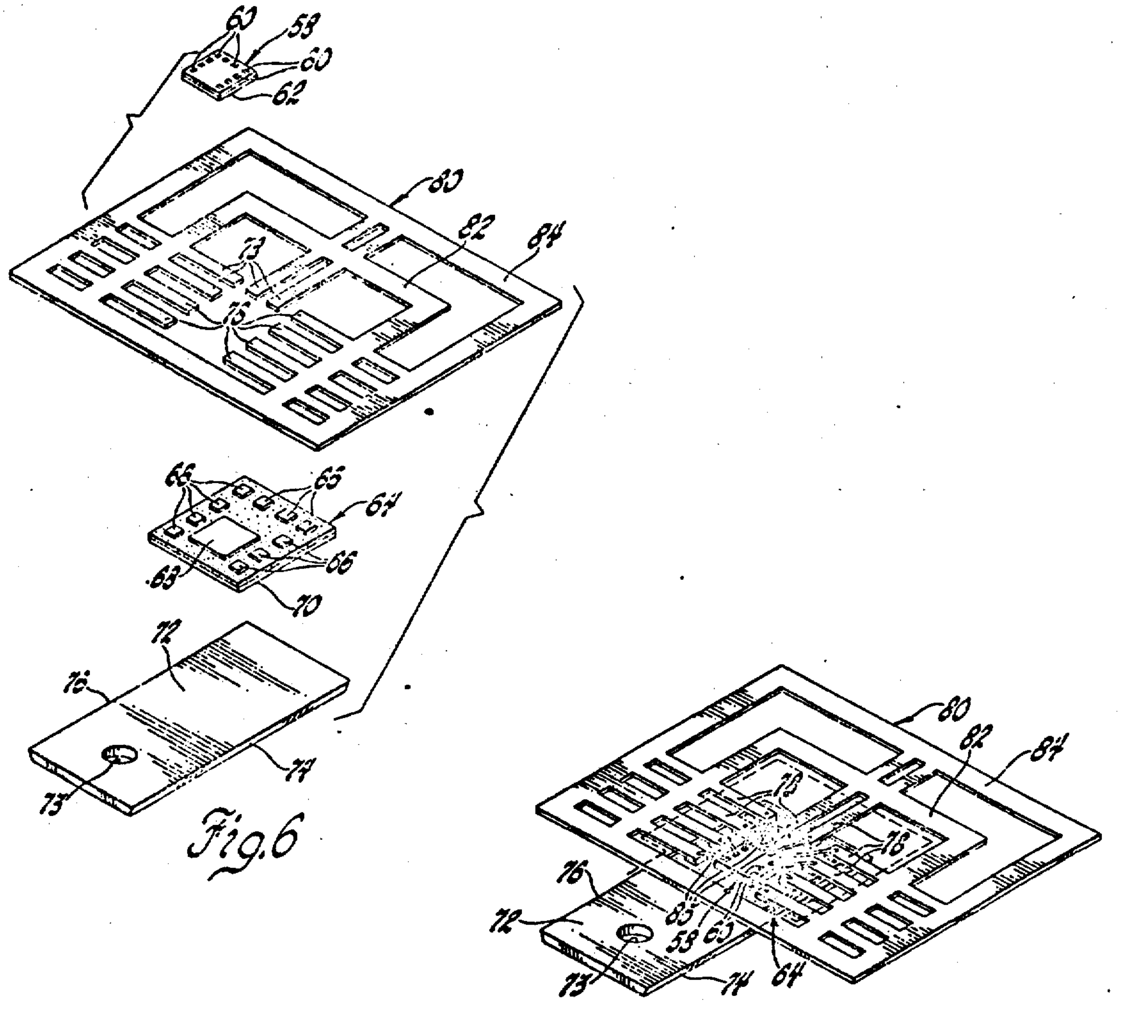
FIG. 6 is an exploded isometric view similar to FIG. 2 of another embodiment of this invention which includes an integrated circuit die.
FIG. 7 is an isometric view of the package of FIG. 6 before encapsulation.
Figure 8:
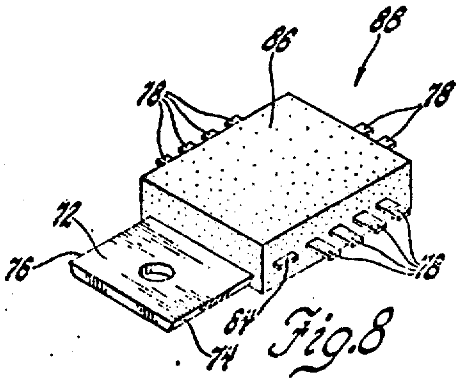
FIG. 8 is an isometric view of the encapsulated package of FIG. 7.

FIGS. 6 – 8 show another embodiment of this invention. A semiconductor monolithic integrated circuit die 58 has a plurality of aluminum electrodes 60 on the periphery of its upper major face. On the opposite face of the die 58 is a solderable coating 62.

a ceramic substrate 64 has a plurality of solderable contact pads on one face. The smaller contact pads 66 correspond in number to the number of electrodes 60 on the die. A larger contact pad 68 partially surrounded by the smaller contact pads 66, provides a solderable surface to which die 58 is soldered. The substrate 64 has a solderable coating 70 in its lower face.

The substrate 64 is soldered to one end of rectangular metallic base member 72, with solder coating 70 being contiguous the upper major surface of the base member 72. The opposite end of base member 72 has a mounting hole 73. The elongated side portions 74 and 76 of base member 72 are mutually divergent towards the top surface of the base member 72, to insure good mechanical adhesion of the plastic encapsulation, as noted in the description of the first embodiment.

Terminal leads 78 are initially a part of rigid lead frame 80. In this embodiment, the terminal leads correspond to the smaller contact pads 66 on the substrate 64. The terminal leads are mutually coplanar and inwardly convergent so that their inner free ends are registered with their respective contact pads 66. The terminal leads are held in this predetermined registry during production by means of a webbing 82 and a peripheral rim portion 84.

As in the first embodiment, the lead frame is constructed in entirety of a tri-layered laminate with one outer layer being of solder, an opposite outer layer of aluminum, and the middle layer being of stainless steel. The terminal leads 78 are soldered, as hereinbefore described, to the smaller contact pads 66, with the solder surface of the terminal leads face down and directly contacting the contact pads 66.

It should be noted that in the embodiment shown no terminal lead is soldered to the die contact pad 68, as was terminal lead 36 to the pad 16 in the first embodiment. This is because in this embodiment, no die backside contact is needed. All electrical connections are made to aluminum electrodes on the upper face of the die. However, for integrated circuit dies requiring a backside electrical connection, it can be provided analogous to that described in connection with FIGS. 1 – 5. In either event, the integrated circuit die 58 is still electrically isolated from the package base member 72, and is in intimate thermal association with the ceramic substrate 64. Thus, heat generated from the die is readily transferred to the base member and dissipated.

Aluminum filamentary wires 85 electrically connect each aluminum electrode 66 with the aluminum outer layer of its corresponding terminal lead 78, as can be seen in FIG. 7. As hereinbefore noted, the aluminum outer surface of the terminal leads, in conjunction with the aluminum filamentary wires and aluminum electrodes, insures a strong and reliable bond. A rubbery silicone gel, such as gel 52 in FIG. 1, covers the integrated circuit die 58, the filamentary wires 85, and its area of interconnection to terminal leads 78.

Referring now to FIG. 8, an encapsulation 86 of plastic surrounds a major portion of the assembly thus described, exposing only the bottom surface of the package base member 72, the outer peripheral rim 84 and webbing 82 of the lead frame 80, and the outer portions of the terminal leads 78. As can be seen in the figures, the sloping edges of the sides 74 and 76 of the base member 72 provide restraining surfaces to prevent the plastic encapsulation from being accidentally pulled apart from the assembly. The lead frame is severed along the lines of the dotted line in FIG. 7 to leave the completed integrated circuit package 88 of FIG. 8.

The two preceeding embodiments are illustrative of power semiconductor device packages which are within the scope of this invention. One skilled in the art will realize that the inventive concept of this invention can be easily applied to package almost all power semiconductor devices including SCR's and the like; and hence, should be limited to packaging only transistor or integrated circuit dies. Therefore, although this invention has been described in connection with certain specific examples thereof, no limitation is intented thereby except as defined by the appended claims.

I claim:

1. A power semiconductor device package comprising:

a power semiconductor device die having two major parallel faces, a plurality of aluminum electrodes on one face thereof providing electrical connection to selected regions of the die, a ceramic substrate having two major parallel faces, a plurality of spaced apart contact pads on one face of the substrate, a solderable coating on the opposite face of the substrate, a solderable area on said one substrate face to which the opposite face of the die is soldered whereby said die is in intimate thermal assocation with the substrate for removing head generated in the die, a discrete terminal lead soldered to the contact pads, each of the leads being a tri-layered laminate with a first outer layer of solder on one surface, a second outer layer of aluminum on an opposite surface, and a middle layer of stainless steel, with the solder layer attached to the contact pads on the substrate, a plurality of aluminum filamentary wires electrically connecting said aluminum electrodes and said aluminum outer layer of said terminal leads, a non-rigid material on said one face of said substrate covering said semiconductor device die, said filamentary wires, and an area in close proximity to the filamentary wire interconnections, a generally flat metallic member having a surface, said opposite face of the substrate soldered to the member surface, and an encapsulating rigid plastic covering said non-rigid material, said substrate, and said one surface of said metallic member, but not the opposite surface of said metallic member and outer portions of said terminal leads.

2. A power integrated circuit package comprising:

a power integrated circuit die having two major parallel faces, a plurality of spaced aluminum electrodes on one face thereof providing electrical connection to selected regions of the die, a solderable coating on the opposite face of the die, a ceramic substrate having two parallel major faces, a plurality of spaced apart contact pads located on one face of said substrate, one of said contact pads being larger than the remainder of said contact pads, a solderable coating on the opposite face of said substrate, said opposite face of said die soldered to said larger of said contact pads wherein said die is in thermal association with said substrate for removing heat from said die, a discrete terminal lead soldered to each of the remaining contact pads on said one face of said substrate, each of said leads being a tri-layered laminate with a first outer layer of solder on one surface, a second outer layer of aluminum on an opposite surface, and a middle layer of stainless steel, with the solder layer attached to said contact pads on said substrate, a plurality of aluminum filamentary wires electrically connecting said aluminum electrodes and said aluminum outer layer of said terminal leads which are soldered to said contact pads on the substrate, a non-rigid material on said one face of said substrate covering said integrated circuit die, said filamentary wires, and an area in close proximity to the filamentary wire interconnections, a generally flat metallic member having a surface, said opposite face of said substrate soldered to said member surface, and an encapsulating rigid plastic covering said non-rigid material, said substrate, and said one surface of said metallic member, but not the opposite surface of said metallic member and outer portions of said terminal leads.

3. A power transistor package comprising:

a power transistor die having a base region with an aluminum electrode on one face, an emitter region with an aluminum electrode on the same face, and a collector region having a solderable coating on the opposite face, a ceramic substrate having two parallel major faces, three spaced apart contact pads on one face of said substrate, one of said contact pads being larger than the other two, a solderable coating on the opposite face of the substrate, said opposite face of said power transistor die soldered to said larger of said contact pads wherein said collector region is electrically connected to said larger contact pad, a discrete terminal lead soldered to each of said contact pads on said one face of said substrate, each of said leads being a tri-layered laminate with a first outer layer of solder on one surface, a second outer layer of aluminum on an opposite surface, and a middle layer of stainless steel, with the solder layer attached to said contact pads on said substrate, an enlarged L-shaped end portion on one of said terminal leads, with said end portion being soldered to said larger contact pad and partially surrounding said power transistor die, an aluminum filamentary wire electrically connecting said base region electrode and said aluminum outer layer of one of the terminal leads soldered to one of the smaller contact pads on said substrate, an aluminum filamentary wire electrically connecting said emitter region electrode and said aluminum outer layer of the terminal lead soldered to the other smaller contact pad on said substrate, a non-rigid material on said one face of said substrate covering said power transistor die, said filamentary wires, and an area on close proximity to the filamentary wire interconnections, a generally flat metallic member having a surface, said opposite face of said substrate soldered to said member surface, and an encapsulating rigid plastic covering said non-rigid material, said substrate and said one surface of said metallic member, but not the opposite surface of said metallic member and outer portions of said terminal leads.

* * * * *

PO-1050
(5/69)

UNITED STATES PATENT OFFICE
CERTIFICATE OF CORRECTION

Patent No. 3,839,660 Dated October 1, 1974

Inventor(s) Harry L. Stryker

It is certified that error appears in the above-identified patent and that said Letters Patent are hereby corrected as shown below:

In the drawings, the attached second sheet of drawings including Figures 6, 7, and 8 should be included in this patent.

In the specification, column 5, line 15, should read -- hence, should "not" be limited to packaging only transistor or --.

In the claims, column 5, line 36, should read -- substrate for removing "heat" generated in the die, --.

Signed and sealed this 3rd day of December 1974.

(SEAL)
Attest:

McCOY M. GIBSON JR.
Attesting Officer

C. MARSHALL DANN
Commissioner of Patents